US011320470B2

(12) United States Patent
Farkas et al.

(10) Patent No.: US 11,320,470 B2
(45) Date of Patent: May 3, 2022

(54) SYSTEM AND METHOD FOR CHANNEL OPTIMIZATION USING VIA STUBS

(71) Applicant: Dell Products L.P., Hopkinton, MA (US)

(72) Inventors: Sandor T. Farkas, Round Rock, TX (US); Bhyrav M. Mutnury, Austin, TX (US)

(73) Assignee: Dell Products L.P., Hopkinton, MA (US)

( * ) Notice: Subject to any disclaimer, the term of this patent is extended or adjusted under 35 U.S.C. 154(b) by 0 days.

(21) Appl. No.: 16/926,621

(22) Filed: Jul. 10, 2020

(65) Prior Publication Data

US 2022/0015233 A1 Jan. 13, 2022

(51) Int. Cl.
*G01R 23/04* (2006.01)
*G01R 23/02* (2006.01)
*G01R 22/00* (2006.01)

(52) U.S. Cl.
CPC ............. *G01R 23/04* (2013.01); *G01R 22/00* (2013.01); *G01R 23/02* (2013.01)

(58) Field of Classification Search
CPC ......... G01R 23/04; G01R 22/00; G01R 23/02
See application file for complete search history.

(56) References Cited

U.S. PATENT DOCUMENTS

| 2005/0255812 A1* | 11/2005 | Na ........................... H04B 1/48 455/78 |
| 2008/0227311 A1* | 9/2008 | Chan .................... H05K 1/0245 439/74 |
| 2009/0049414 A1* | 2/2009 | Mutnury .............. H05K 1/0251 716/132 |
| 2019/0228950 A1* | 7/2019 | Funk ................. H01J 37/32146 |

\* cited by examiner

*Primary Examiner* — Akm Zakaria
(74) *Attorney, Agent, or Firm* — Chamberlain, Hrdlicka, White, Williams & Aughtry (57) ABSTRACT

Embodiments described herein relate to a method for modifying transmission line characteristics. The method may include: making a first determination of a null frequency of an input signal to a transmission line; performing an analysis to make a second determination of a wavelength of the input signal using, at least in part, the null frequency; making a third determination, based on the analysis, of a half wavelength of the input signal; calculating, based on the half wavelength, a total stub length; and adding a trace to a stub associated with a via, wherein the stub and the trace are a length that is at least a portion of the half wavelength of the input signal.

12 Claims, 6 Drawing Sheets

SYSTEM AND METHOD FOR CHANNEL OPTIMIZATION USING VIA STUBS

BACKGROUND

Computing devices (e.g., personal computing devices, servers, network devices, etc.) often include some amount of circuitry (e.g., circuit components (resistors, transistors, capacitors, inductors, diodes, power sources, transformers, modulators, oscillators, sensors, etc.), wires, wire traces, etc.) through which electric current may flow and/or be manipulated in some way. Such circuitry may, for example, be packaged as an integrated circuitry package, which, in turn, may be attached in some way (e.g., via a high speed bus) to a circuit board (e.g., a printed circuit board (PCB)). Such a circuit board may provide electrical connections and/or mechanical support for any number of integrated circuitry packages or other circuitry, and may be attached to such circuitry using any type of attachment technique. For example, an integrated circuitry package may be attached to a PCB using a ball grid array (BGA), which may have, for example, an array of solder bumps to be soldered to connection points, which may be referred to as via pads, on a PCB. Circuit boards may also be used independent of any integrated circuitry packages, and may still provide electrical connections between components of any type that may be connected to the circuit board to facilitate the creation of any one or more circuit types.

Certain electrical signals may have signaling speeds. Such signaling speeds vary based on the technology of the signal. For example, peripheral component interconnect (PCI) standards, Ethernet standards, etc. may use a different signaling speeds (e.g., 8 GHz, 16 GHz, 32 GHz, etc. for various PCIe standards) based on the generation of the technology standard. Such signals may propagate, at least in part, using vias coupled to electrical traces present within a conductive layer of a circuit board. Such signals may be delivered to such electrical traces from the surface of the circuit board (or from another layer within the circuit board) using conductive vias.

Vias often exist as and/or within holes in the circuit board. Vias may extend through more layers of the circuit board than are required to deliver the signal to the appropriate layer of the circuit board. The additional distance after the layer of transition of the signal from a via to a trace of a layer may be referred to as a stub. Such stubs may have an adverse effect on the signal quality of the signal being transmitted. For example, the signal may split upon reaching the transition layer, with some portion of the signal travelling down the trace, and another portion traveling through the stub. The portion traveling through the stub may, in some cases, be reflected back and recombined with the signal on the trace, which may cause undesired consequences in the signal integrity of the signal being sent along the trace to the destination of the signal. In certain circumstances, the length of the stub may be a length relative to the wavelength of the input signal such that the reflection degrades or even substantially cancels out the input signal at a given point, which may lead to increased signaling errors (e.g., bit rate errors).

SUMMARY

In general, embodiments described herein relate to a method for modifying transmission line characteristics. The method may include: making a first determination of a null frequency of an input signal to a transmission line; performing an analysis to make a second determination of a wavelength of the input signal using, at least in part, the null frequency; making a third determination, based on the analysis, of a half wavelength of the input signal; calculating, based on the half wavelength, a total stub length; and adding a trace to a stub associated with a via, wherein the stub and the trace are a length that is at least a portion of the half wavelength of the input signal.

In general, embodiments described herein relate to a method for modifying transmission line characteristics. The method may include: making a first determination of a null frequency of an input signal to a transmission line; performing an analysis to make a second determination of a wavelength of the input signal using, at least in part, the null frequency; making a third determination, based on the analysis, of a half wavelength of the input signal; calculating, based on the half wavelength, a total stub length; and adding a trace to a stub associated with a via, wherein the stub and the trace are a length that is at least a portion of the half wavelength of the input signal, and another portion comprises a resistor and a capacitor.

In general, embodiments described herein relate to a system for modifying transmission line characteristics. The system may include a circuit board coupled to a signal source and including: a via transmission line portion configured to receive an input signal, wherein the input signal has a null frequency; an inner layer transmission line portion coupled to destination circuitry; a via stub extending from an end of the via transmission line portion below the inner layer transmission line portion; and a stub addition comprising a conductive trace and operatively connected to ground, wherein the via stub and the stub addition are a length that is at least a portion of a half wavelength of the input signal.

DETAILED DESCRIPTION

Certain specific embodiments will now be described with reference to the accompanying figures.

In the below description, numerous details are set forth as examples of embodiments described herein. It will be understood by those skilled in the art and having the benefit of this Detailed Description, that one or more embodiments of embodiments described herein may be practiced without these specific details and that numerous variations or modifications may be possible without departing from the scope of the embodiments described herein. Certain details known to those of ordinary skill in the art may be omitted to avoid obscuring the description.

In the below description of the figures, any component described with regard to a figure, in various embodiments described herein, may be equivalent to one or more like-named components described with regard to any other figure. For brevity, descriptions of these components may not be repeated with regard to each figure. Thus, each and every embodiment of the components of each figure is incorporated by reference and assumed to be optionally present within every other figure having one or more like-named and/or similar components. Additionally, in accordance with various embodiments described herein, any description of the components of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct (e.g., wired directly between two devices or components) or indirect (e.g., wired and/or wireless connections between any number of devices or components connecting the operatively connected devices) connection. Thus, any path through which information may travel may be considered an operative connection. In certain instances, an operative connection maybe described as a coupling between two devices.

Additionally, directional words (e.g., top, bottom, above, below, etc.) may be used as an adjective to a noun or as a relative location of an element or component. The use of directional words is not meant to imply any required orientation within any two dimensional plane or three dimensional space. For example, the use of the words "top" and "bottom" are meant to convey relative positions, rather than any fixed position. The use of such words may instead convey a spatial relationship between a component and some other component. For example, the "top" of one component (e.g., the "surface" of the component) may refer a portion of the component that is intended to be connected, at least in part, to a portion of another component, which may, in turn, be referred to as the "bottom" of the other component.

In general, embodiments described herein relate to methods and systems for optimizing channel characteristics using via stubs. In one or more embodiments, there exists a need to increase performance of computing devices while attempting to minimize cost. In one or more embodiments, increasing computing device performance and feature sets may require higher speed busses and/or higher component density. Such requirements may lead to more complex circuit board designs that may have several challenges. First, higher signaling speeds and higher complexity may lead to thicker, higher layer count circuit boards, which may lead to longer stubs in such circuit boards. In one or more embodiments, as bus speeds increase (e.g., to 32 gigabits per second (Gbps) and beyond), the signal integrity (SI) margins may be slim and, thus, stub length should be addressed and controlled.

Prior techniques using a backdrill process may reduce stub length, but may also present limitations on routability, power delivery, etc. For example, the additional cost of performing backdrills for vias may add significant cost to the circuit board fabrication process (e.g., 4%-15% of total circuit board fabrication costs, depending on number of sides, depth, drill count, and accuracy). In one or more embodiments, for large ultra-low loss designs, techniques such as backdrilling may cost tens of dollars per circuit board.

Losses relating to an input signal in a circuit board increase with frequency of the signal. In one or more embodiments, the circuit board needs to compensate for the loss difference between low and high frequencies by applying equalization. In one or more embodiments, high speed busses on long traces may require equalization beyond the range for which a given circuit board may be able to perform efficiently.

In view of the above, it may be advantageous to use certain characteristics of a transmission line with at least one stub to improve the signal integrity of the input signal on the path of the transmission line by adjusting the length of the stub with an additional trace length, one or more resistors, and an optional capacitor, between the end of the stub and the ground plane of the circuit board (thereby creating a 'short' to ground).

Figure 1:
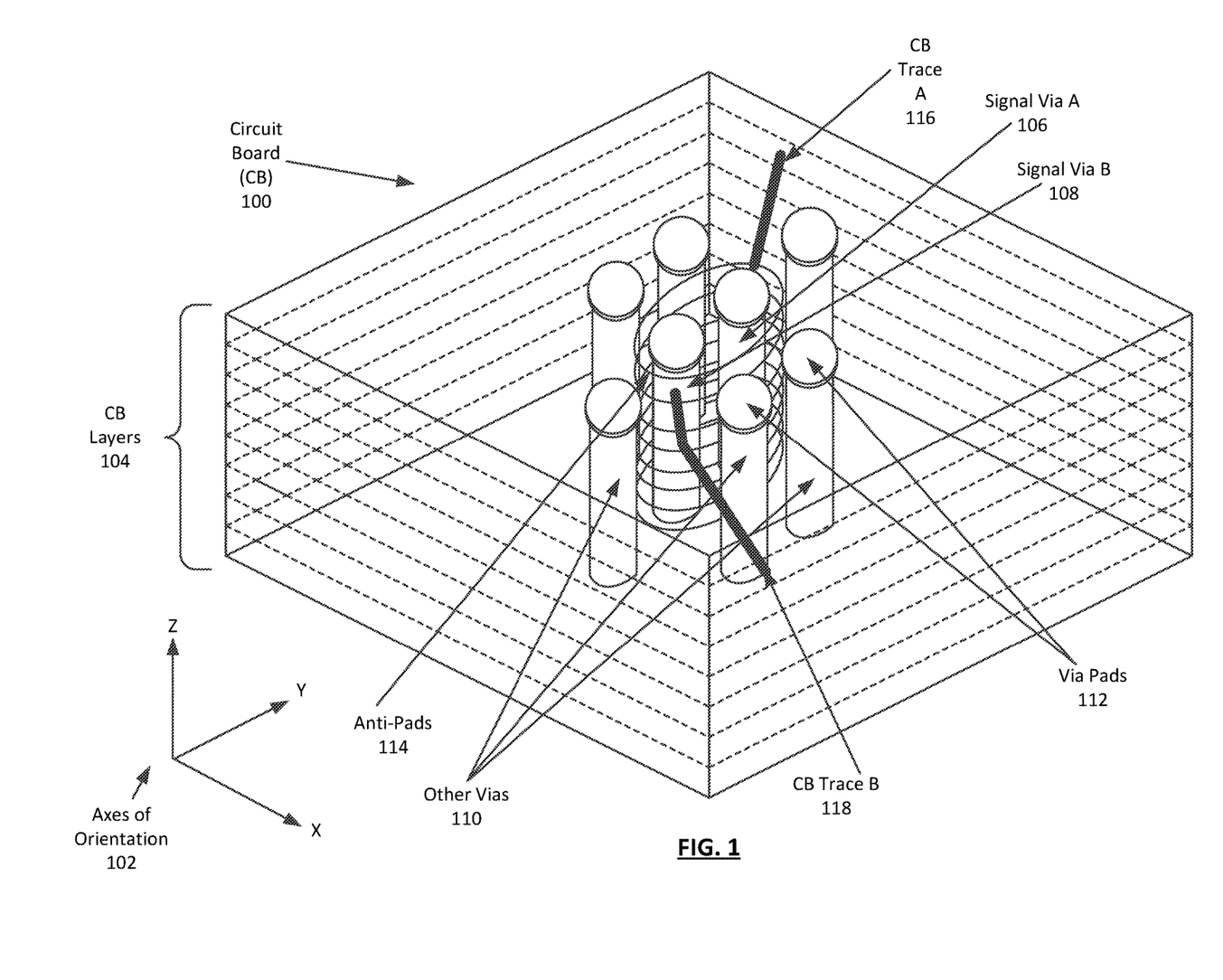
FIG. 1 shows a perspective view of a circuit board in accordance with one or more embodiments of the invention.

FIG. 1 shows a perspective view of a circuit board in accordance with one or more embodiments of the invention. As shown in FIG. 1, the circuit board (CB) (100) is positioned, for the sake of clarity, at an orientation within three dimensional space as indicated by the axes of orientation (102). In one or more embodiments of the invention, the CB (100) includes any number of CB layers (104). The CB (100) may include any number of vias (e.g., signal via A (106), signal via B (108)), any number of other vias (e.g., other vias (110)), any number of via pads (e.g., via pads (112)), any number of anti-pads (e.g., anti-pads (114)), and any number of CB traces (e.g., CB trace A (116), CB trace B (118)). Each of these components is described below.

In one or more embodiments, a CB (100) is any structure that is configured to provide electrical connections between and/or within components (e.g., circuit components, integrated circuitry packages, etc.) that are attached in any way to the CB. In one or more embodiments of the invention, a CB (100) may also provide mechanical support for any such components (e.g., within a computing device). A non-limiting example of a CB is referred to as a printed circuit board (PCB).

In one or more embodiments of the invention, a computing device is any device or any set of devices that includes circuitry. Computing devices are discussed further in the description of FIG. 6, below. Specifically, as used herein, a computing device is any device or set of devices that includes any circuitry attached in any way to any one or more CBs. As an example, a computing device may be any device capable of electronically processing instructions and that includes, at least, one or more processors (e.g., integrated circuitry), any amount of volatile or non-volatile memory or storage, and/or any number of input and output device(s).

Examples of computing devices include, but are not limited to, a server (e.g., a blade-server in a blade-server chassis, a rack server in a rack, etc.), a desktop computer, a mobile device (e.g., laptop computer, smart phone, personal digital assistant, tablet computer, and/or any other mobile computing device), a network device (e.g., a multilayer switch, a router, a bridge, etc.), a storage device, a media device (e.g., televisions), and/or any other type of computing device.

Such a computing device may include any number of CBs, each attached to any type of circuitry, with the CBs and circuitry arranged in any configuration. As an example, computing devices often include a type of CB referred to as a motherboard, to which integrated circuitry packages are connected via a high speed bus. Other CBs (e.g., expansion cards, daughter boards, etc.) may also be connected to a motherboard, and may further be connected to additional circuitry packages. All or any portion of the collection of CBs and circuitry, along with any other computing device components, may collectively operate to perform any or all of the intended function of the computing device (e.g., process data, process network traffic, display output information, etc.).

In one or more embodiments of the invention, a CB (100) includes CB layers (104). Although FIG. 1 shows eight CB layers (104), a CB (100) may include any number of CB layers. Each CB layer (104) may have any thickness and may be constructed of any material(s). In one or more embodiments, the CB layer at the top may be referred to as a top layer, and may interface with other circuitry. In one or more embodiments, the bottom layer may be a ground plane layer, and may interface with a connection to a ground. In one or more embodiments, layers between the top layer and the ground layer may be referred to as inner layers. In one or more embodiments, the ground layer is not actually at the bottom of the circuit board, and any number of other layers may exist below or above such a ground layer without departing from the scope of the invention.

As an example, the CB (100) may be a PCB. In one or more embodiments of the invention, a PCB is a CB that includes a number of layers attached to one another. At least some of the CB layers (104) are conductive layers, which may be constructed, at least in part, from any conductive material, and which may be separated from one another by any number of non-conductive layers (e.g., a substrate) of any non-conductive (or less conductive) material. One non-limiting example of a conductive material within a conductive layer is copper. One non-limiting example of a non-conductive material in a non-conductive layer is fiber glass. Other types of conductive and/or non-conductive materials (e.g., a silicon based substrate material) may be included in CB layers (104) without departing from the scope of the invention.

The CB layers (104) may include any number of other layers of any type. For example, the CB (100) may have a top layer (i.e., the layer farthest in the Z direction as indicated by the axes of orientation (102)) that may be referred to as a solder mask or solder resist, which functions to help prevent shorts between solder locations at which integrated circuitry packages are attached to the CB (100). As another example, the PCB may include a layer, such as a silkscreen layer, on top of the solder mask layer that includes, for example, printed information relating to identification of components and/or locations on the CB (100).

In one or more embodiments of the invention, within conductive layers of the CB (100) are conductive traces (e.g., CB trace A (116), CB trace B (118)), which provide at least a portion of signal propagation paths through which a signal may propagate (e.g., via a signal propagation path) from one portion of the CB (100) to another within the conductive layer. In one or more embodiments of the invention, a signal propagation path is a conductive path through which electricity (e.g., the signal) propagates. There may be any number of CB traces (116, 118) in any conductive layer of a CB (100). For example, in the embodiment shown in FIG. 1, CB trace A (116) and CB trace B (118) both exist in the layer that is second from the top of the CB (100).

In one or more embodiments of the invention, the CB traces (116, 118) operate as wires that are fixed in place within a given conductive layer of a CB (100). In one or more embodiments of the invention, the CB traces (116, 118) are separated from other portions of the conductive layer and/or from portions of other conductive layers via an insulator (e.g., air, fiber glass, etc.). In one or more embodiments of the invention, other portions within a conductive layer of a CB (100) are used for any other purpose, such as, for example, electromagnetic shielding.

CB traces (116, 118) may provide at least a portion of a signal propagation path for any type of electrical signal. Examples of such electrical signals include, but are not limited to, power signals, ground signals, or any signal that conveys any information, or any portion of any information. For example, a signal may be a signal that alternates between a higher and lower level of signal (e.g., two voltage levels), which may be interpreted as a binary signal and that conveys some form of information. As another example, the signal may be an analog signal, in which some signal feature (voltage, current, phase, etc.) may be used convey potentially changing information (e.g., pressure, velocity, temperature, etc.). As another example, two or more signals may be paired together, with the information being conveyed to a receiver by a relative difference between one or more signal properties of the signals.

In one or more embodiments of the invention, signals are passed between and/or through CB layers using vias (e.g., signal via A (106), signal via B (108), other vias (110)). A CB (100) may include any number of vias. As an example, in the embodiment shown in FIG. 1, the portion of the CB (100) shown includes eight vias. However, for the sake of clarity, only signal via A (106), signal via B (108), and three of the six other vias (110) are indicated using an arrow. In one or more embodiments, at least a portion of the other vias (110) are ground vias that allow for connection of any CB layer to a ground plane within the CB (100).

In one or more embodiments of the invention, a via (106, 108, 110) is a hole in a CB (100) that extends from one or more surfaces of the CB (e.g., the top) through any number of CB layers (104). In one or more embodiments of the invention, a via is coated (e.g., on the inside surface of the hole) with a conductive material (e.g., copper) (not shown). The electrical coating may allow the via (106, 108, 110) to serve as a conductive signal propagation path through any number of CB layers (104). Additionally or alternatively, a via (106, 108, 110) may be filled with a conductive material as opposed to being coated.

A via (106, 108, 110) may have one or more exit points at which a signal propagating along the via exits the via to a CB trace (e.g., 116, 118) within a conductive layer of the CB (100). Such an exit may occur at any conductive layer in a CB (100) and may be referred to as a transition. The exit of a signal from a via to a trace may require the signal to change the physical direction in which the signal is propagating.

In one or more embodiments, though not labeled in FIG. 1, any portion of a via below a transition to a trace in a CB layer may be referred to as a stub. In one or more embodiments, a stub is a result of the continuation of a via beyond the transition point, and may effectively be an open circuit path that does not end in an additional connection without modifications made pursuant to embodiments described herein.

As an example, as shown in FIG. 1, CB trace A (116) and the via to which it is connected, signal via A (106), represent a transition that a signal must traverse when traveling from the surface of the CB to the trace. Specifically, as shown in FIG. 1, a transition in signal direction must occur because of a change from the Z direction shown on the axes of orientation (102) into a direction within the X-Y plane of the axes of orientation (e.g., a 90 degree turn).

In one or more embodiments of the invention, once the signal reaches the transition point, a portion of the signal may continue through the stub, with the rest transferring to the appropriate trace. Such a bifurcation of the signal may degrade the signal integrity, as the portion of the signal that was transmitted on the stub may be reflected back to the intended signal propagation path after traversing the length of the stub once to get to the end of the stub and another length of the stub after being reflected. In certain situations, such reflection from the stub may degrade signal integrity. For example, if the stub length is a quarter of the wavelength of the signal, then two times the stub length (i.e., the 'flight time') of the reflected signal would be a half wavelength, which may substantially cancel out the signal being transmitted once recombined with the signal, leading to signal integrity errors.

One type of via of the embodiment shown in FIG. 1 is referred to as a signal via (e.g., signal via A (106), signal via B (108)). In one or more embodiments of the invention, signal vias (106, 108) provide at least a portion of signal propagation paths for electrical signals intended to convey information. For example, in the embodiment shown in FIG. 1, two CB traces are in the same layer (e.g., 116, 118 in the second layer from the top), which may be used as a differential signal pair. In such an embodiment, the signal vias (106, 108) each convey one of the electrical signals that are used to convey information to a receiving entity using a difference between the electrical signals. Although the CB traces (116, 118) are shown in FIG. 1 as heading in generally opposite directions, one having ordinary skill in the art, and the benefit of this Detailed Description will recognize that the traces of a differential signal pair may have any spatial relationship with one another within a given conductive layer of a CB. For example, they may be closer to one another and generally in the same direction.

Another type of via of the embodiment shown in FIG. 1 is referred to herein as an other via (110). As discussed above, although there are six other vias shown in FIG. 1, only three are indicated with an arrow for the sake of clarity. In one or more embodiments of the invention, other vias (110) provide at least a portion of signal propagation paths through CB layers (104) for any type of electrical signal that is to be separated from other electrical signals for any reason, or to provide a path to a ground plane.

As an example, in the configuration of vias shown in FIG. 1 (i.e., a six on two configuration), the two signal vias (106, 108) are used to transmit electrical signals intended to convey information, while the other vias (110) are intended to convey power and ground signals. Accordingly, the other vias (110) must be separated from the signal vias (106, 108), which may occur by the creation of anti-pads (114) around the signal vias. Anti-pads are discussed further below, but may not be used in certain embodiments described herein.

In one or more embodiments of the invention, each via (106, 108, 110) of a CB (100) has a pad (112) on the top (i.e., surface layer). For the sake of clarity, although each of the eight vias shown in FIG. 1 are shown having a pad, only two pads (112) are indicated using an arrow. In one or more embodiments of the invention, a pad is a portion of an exposed conductive material (e.g., a metal) at the surface of a CB that covers and/or is otherwise in electrical contact with a via (106, 108, 110). In one or more embodiments of the invention, a via pad is used to allow other components, such as, for example, high speed busses, to be electrically connected to one or more vias of the CB (100). For example, an array of pins of an integrated circuitry package may have balls of solder attached to the pins. The balls of solder may be positioned to align with the pads of the CB, thereby allowing for an electrical connection between the pins of the integrated circuitry packages and the CB traces of the CB using the solder balls, the pads, and the underlying vias.

In one or more embodiments of the invention, any set of one or more signal vias (and the pads of the vias) may have around the set an anti-pad. For example, in the embodiment shown in FIG. 1, signal via A (106) and signal via B (108) are within the anti-pads (114) of each of the CB layers (104). For the sake of clarity, although FIG. 1 shows an anti-pad in every layer of the CB (100), the identifying arrow only points to the anti-pad in the top layer. In one or more embodiments, anti-pads are not used. Additionally, in one or more embodiments, signal vias may be single vias that are not in pairs, and may or may not have anti-pads, but still provide a signal propagation path for an input signal.

In embodiments of the invention that have anti-pads, an anti-pad is a clearance hole between the via and pads, and the rest of a layer of the CB (100). In one or more embodiments of the invention, an anti-pad physically separates a set of one or more vias from layers of a CB (100), and, in particular, from conducting layers of the CB, and/or from other vias (110). Such physical separation may create an electrical separation between the vias and the conductive layers and/or other vias.

For example, the other vias (110) may allow propagation of power and ground signals to certain conducive CB layers (104) from which the signal vias (106, 108) need to be electrically separated so that the signals are not shorted by the ground and/or power signals. In one or more embodiments of the invention, the anti-pads (114) may exist in any number of CB layers, may or may not create a hole through all CB layers, and may be of any shape of any area or diameter. In one or more embodiments of the invention, though not shown in FIG. 1, the areas of anti-pads are determined by the layer in which a transition occurs from a via to a CB trace. Accordingly, one set of anti-pads (114) of a CB (100) may have one area, while another set of anti-pads of a CB have a different area, which may be larger or smaller, depending on the transition depth for signals propagating using vias within the anti-pads. In one or more embodiments of the invention, though not shown in FIG. 1, the areas of anti-pads (114) may vary from layer to layer.

While FIG. 1 shows a configuration of components, other configurations may be used without departing from the scope of the invention. For example though FIG. 1 shows the portion of a CB in a particular orientation as indicated by the axes of orientation, the axes of orientation are not intended to imply any particular orientation, only to show the particular perspective view related to the orientation shown in FIG. 1 within three dimensional space. Accordingly, embodiments disclosed herein should not be limited to the configuration or orientation of components shown in FIG. 1.

Figure 2:
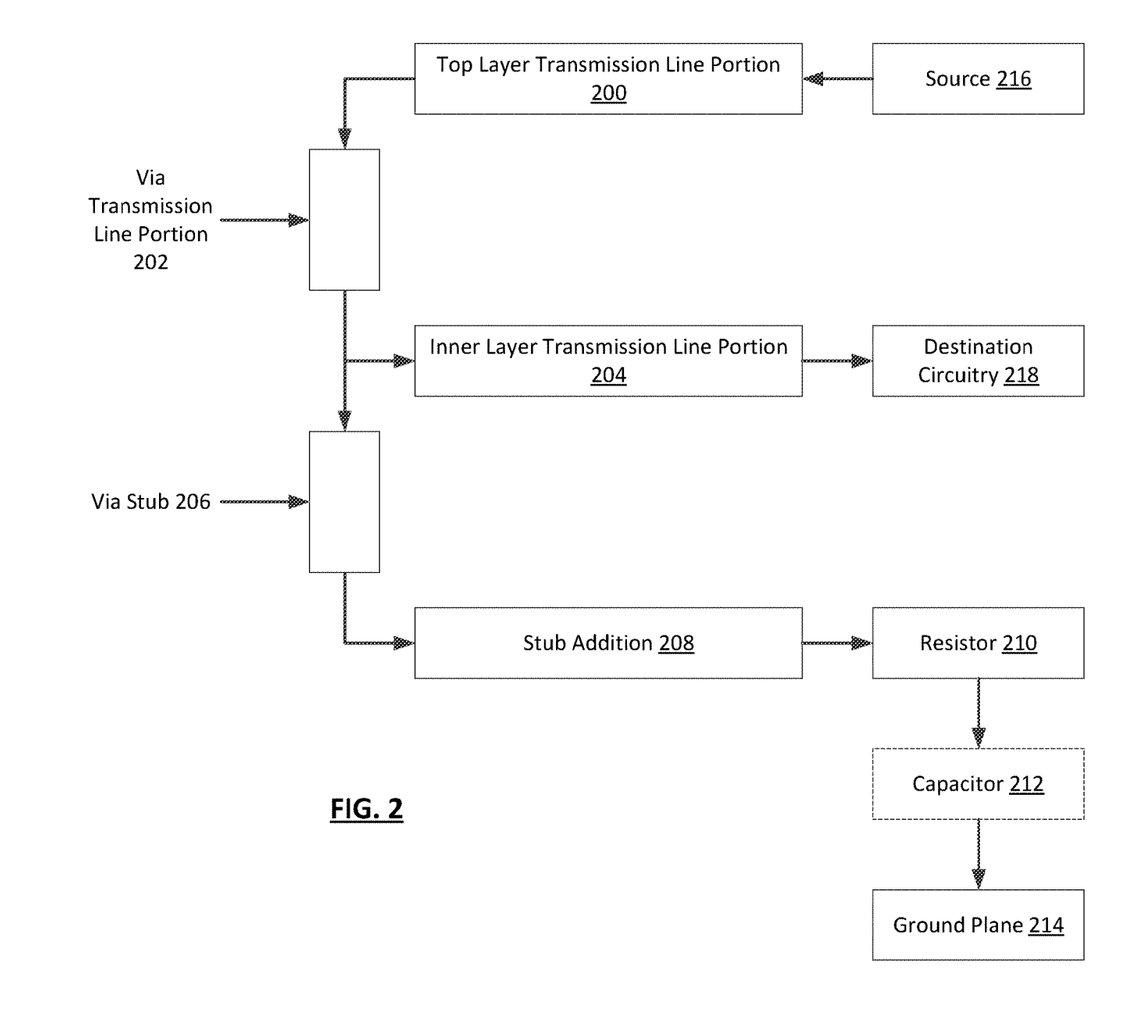
FIG. 2 shows a system in accordance with one or more embodiments of the invention.

FIG. 2 shows an exemplary view of a signal propagation path within a circuit board in accordance with one or more embodiments of the invention. As shown in FIG. 2, the signal propagation path includes a source (216), a top layer transition portion (200), a via transmission line portion (202), an inner layer transmission line portion (204), destination circuitry (218), a via stub (206), a stub addition (208), a resistor (210), an optional capacitor (212) and a ground plane (214). Each of these components is described below.

In one or more embodiments, a source (216) is any device, element, or component that produces and/or otherwise provides to a circuit board an electrical signal. For example, a source may be a PCIe bus coupled to a storage device through an expansion card, and to the processor and/or memory of a computing device.

In one or more embodiments, a top layer transmission line portion (200) is any portion of a top layer of a circuit board that includes functionality to receive a signal from a signal source (216). For example, a top layer transmission line portion may be an electrically conductive portion of a top layer of a circuit board that is coupled to a portion of the source (216) for the purpose of communicating electrical signals to and/or from the source (216).

In one or more embodiments, a via transmission line portion (202) is at least a portion of a via within a circuit board. In one or more embodiments, the via transmission line portion is substantially similar to the signal vias (106, 108) discussed above in the description of FIG. 1. As such, the via transmission line portion (202) provides a conductive path for the signal from the source (216) to propagate within the circuit board to an appropriate inner layer for continued propagation towards the destination on the signal.

In one or more embodiments, at least a portion of the signal from the source (216) propagates further along the inner layer transmission line portion (204). In one or more embodiments, the inner layer transmission line portion is a conductive path in a layer within the circuit board that provides a portion of the path of propagation for the signal from the source (216), and is coupled to the via transmission line portion (202).

In one or more embodiments, the system includes destination circuitry (218) coupled to the inner layer transmission line portion (204). In one or more embodiments, the destination circuitry (218) is any circuitry to which the signal from the source (216) is transmitted for any reason. For example, the destination circuitry may include additional traces within the circuit board, the circuitry of a processor, etc.

In one or more embodiments, the system also includes a via stub (206). In one or more embodiments, a via stub (206) is any portion of a via that extends into the circuit board beyond the layer of transition of a signal from the via transmission line portion (202) to the inner layer transmission line portion (204). In one or more embodiments, the via stub (206) may be any length, and may result from the fabrication techniques used to produce the circuit board.

In one or more embodiments, the via stub (206) is coupled to a stub addition (208). In one or more embodiments, the via stub (206) acts as a transmission line for a portion of the signal from the source (206), with the amount of the signal propagating through the via stub (206) depending, at least in part, on the impedance of the via stub (206). In one or more embodiments, the stub addition (208) is an additional portion of a conductive path coupled to the via stub (206) to adjust the length of the propagation path that includes the via stub (206) and the stub addition (208). For example, the stub addition may be an additional portion of conductive copper trace that operatively couples the via stub (206) to the ground plane (214), and which adds a desired amount of length to the propagation path in order to achieve certain path characteristics beneficial to the signal integrity of the signal intended for the destination circuitry (218).

In one or more embodiments, the stub addition (208) is operatively connected to a resistor (210). In one or more embodiments, a resistor is any circuit element that provides impedance/resistance along a path of electrical conductivity. In one or more embodiments, the resistor (210) is included to reduce sensitivity of the system to tolerance considerations of the system with regards to the length of the via stub (206) plus the stub addition (208) on the path to the ground plane (214). As such, in one or more embodiments, the non-zero length of the resistor may be taken into account when determining the length of the stub addition (208), and the resistor (210) also adds length to the path. As a non-limiting example, the resistor (210) may be a resistor with a resistance value of five to ten ohms.

In one or more embodiments, an optional capacitor (212) is included in the propagation path between the resistor (210) and the ground plane (214). In one or more embodiments, the capacitor (212) is included if a possibility exists that the input signal may be a direct current signal or a signal that has a relatively low frequency. In such a scenario, a short to the ground plane would be undesirable, and the capacitor (212) would effectively prevent such a short.

In one or more embodiments, the stub addition (208), through the resistor (210) and/or the capacitor (212), is operatively connected to the ground plane (214). In one or more embodiments, the ground plane (214) is any layer within the circuit board that provides a common return path at which a signal or any portion thereof may be received, and may serve as a reference from which certain signal characteristics are measured.

While FIG. 2 shows a configuration of components, other configurations may be used without departing from the scope of the invention. For example though FIG. 2 shows a particular propagation path in a circuit board, a circuit board may include any number of such paths, each of which may include additional or less elements than shown in FIG. 2. Accordingly, embodiments disclosed herein should not be limited to the configuration or orientation of components shown in FIG. 2.

Figure 3A:
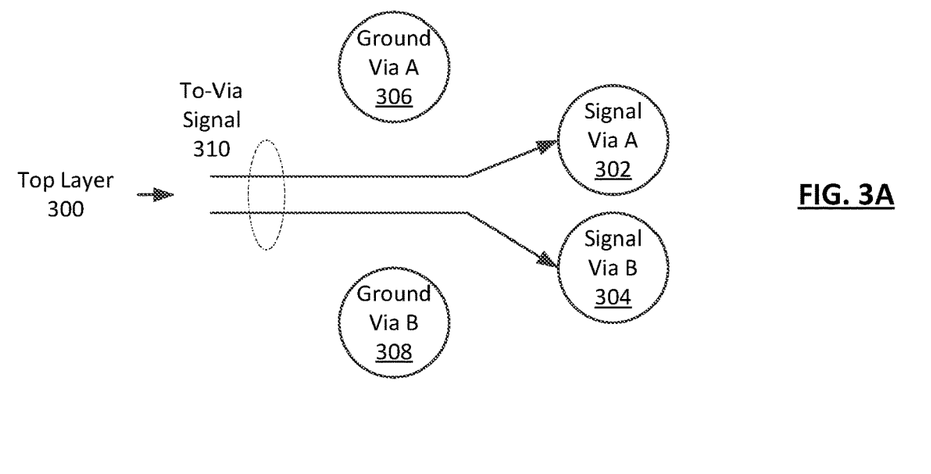
FIG. 3A shows a top layer of a circuit board in accordance with one or more embodiments of the invention.
Figure 3B:
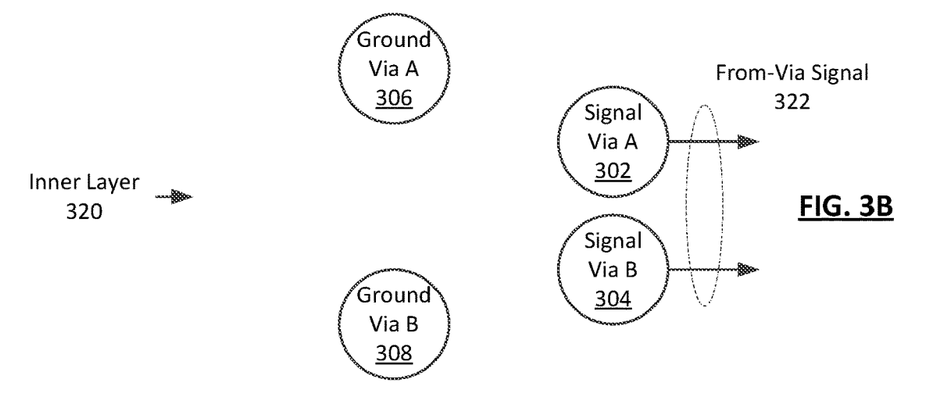
FIG. 3B shows an inner layer of a circuit board in accordance with one or more embodiments of the invention.
Figure 3C:
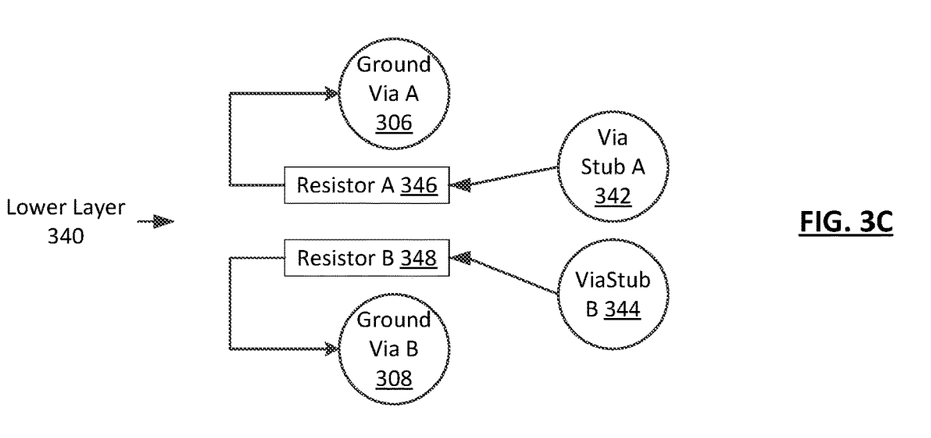
FIG. 3C shows a bottom layer of a circuit board in accordance with one or more embodiments of the invention.

FIGS. 3A-3C show electrical connections within layers of a circuit board as discussed, in part, in the descriptions of FIG. 1 and FIG. 2, above. As shown in FIG. 3A, the top layer (300) includes a to—via signal (310), signal via A (302), signal via B (304), ground via A (306), and ground via B (308). Each of these components is described below.

In one or more embodiments, the to—via signal (310) is any electrical signal provided from a source (e.g., source (216) of FIG. 2) to any number of signal vias (302, 304). Although FIG. 3A shows the to—via signal (310) as a differential signal pair, one having ordinary skill in the art will recognize that the to—via signal (310) may instead be a single signal to one signal via, or any number of signal portions to any number of signal vias without departing from the scope of embodiments described herein. In one or more embodiments, the ground vias (306, 308) exist to provide, as necessary, a path to a ground plane of the circuit board for any purpose.

FIG. 3B shows electrical connections of an inner layer (320) within a circuit board. In one or more embodiments, the signal vias (302, 304) are extensions of the signal vias shown in FIG. 3A, and provide an electrical connection to the circuit board traces of the inner layer (320) at which the signal is to transition. In one or more embodiments, once the signal is received by the signal vias (302, 304) in the inner layer (320), at least a portion of the signal transitions as a from—via signal (322) to traces of the inner layer (320) of the circuit board.

FIG. 3C shows electrical connections of a lower layer (340) of a circuit board. In one or more embodiments, the lower layer (340) includes via stub A (342) and via stub B (344), which are the stubs that are below the signal vias (302, 304) of FIG. 3A and FIG. 3B. In one or more embodiments, the via stubs (342, 344) are coupled, respectively, to resistor A (346) and resistor B (348). Additionally, the resistors (346, 348) are each coupled to respective ground vias (306, 308) that provide a path to the ground plane of the circuit board.

In one or more embodiments, the arrows in FIG. 3C from the via stubs (342, 344) to the resistors (346, 348), plus the length of the resistors, plus the length of the arrows from the resistors to the ground vias (306, 308), represent an addition to the length of the path that includes the via stubs (342, 344) below the transition layer of the signal, and may be configured to have a certain length relative to the wavelength of the signal. In one or more embodiments, adjusting such length allows for reflections of the signal from the stubs to have less degrading and/or less destructive impact on the signal being sent to the destination circuitry (218), thereby improving signal integrity. For example, the length of the propagation path added to the stubs may have the effect of shifting an attenuation point at a given frequency to align with a portion of the input signal at which little or no power is being transmitted, thereby mitigating the effects of the attenuation at that frequency.

While FIGS. 3A-3C show configurations of components, other configurations may be used without departing from the scope of the invention. For example though FIGS. 3A-3C show a various propagation paths in a circuit board, a circuit board may include any number of such paths, each of which may include additional or less elements than shown in FIGS. 3A-3C. Accordingly, embodiments disclosed herein should not be limited to the configuration or orientation of components shown in FIGS. 3A-3C.

Figure 4:
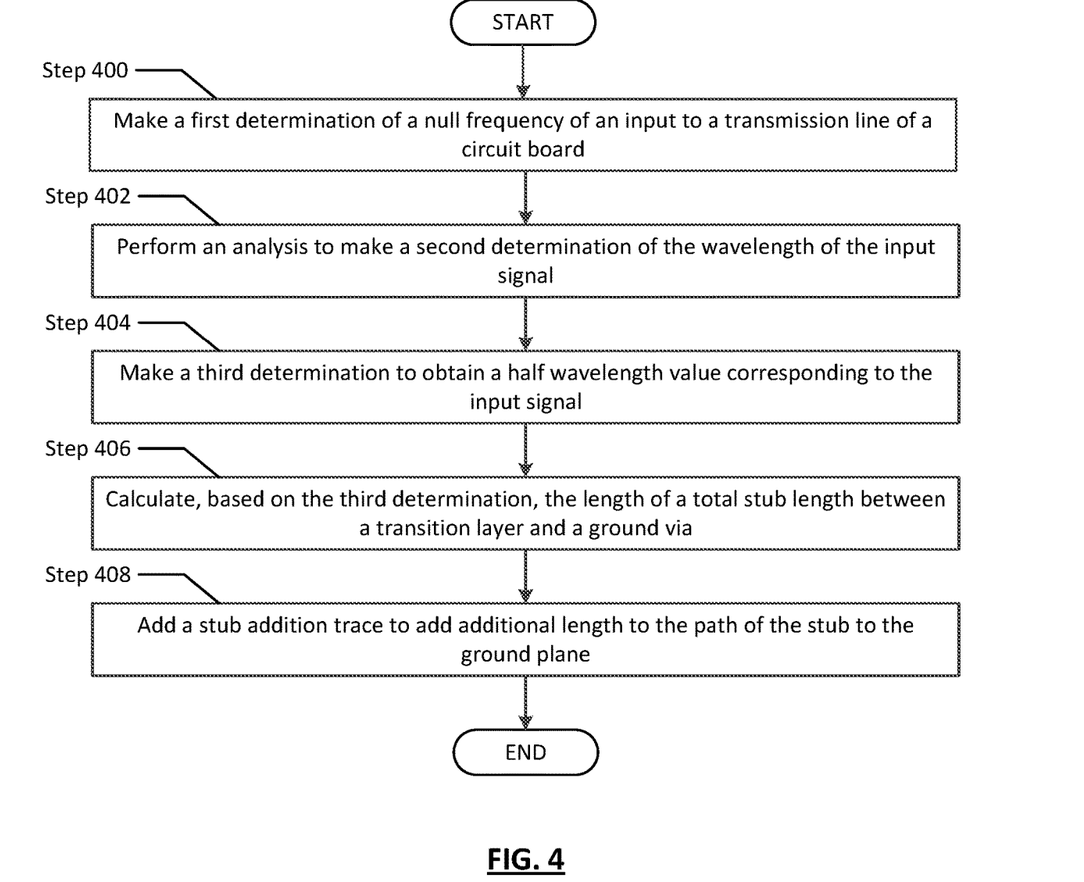
FIG. 4 shows a flowchart in accordance with one or more embodiments of the invention.

FIG. 4 shows a flowchart describing a method for optimizing a signal propagation path by adjusting stub length relative to a ground plane in accordance with one or more embodiments disclosed herein.

While the various steps in the flowchart shown in FIG. 4 are presented and described sequentially, one of ordinary skill in the relevant art, having the benefit of this Detailed Description, will appreciate that some or all of the steps may be executed in different orders, that some or all of the steps may be combined or omitted, and/or that some or all of the steps may be executed in parallel.

In Step 400, a determination is made of a null frequency of an input signal to a via of a circuit board. For example, the data rate of PCIe Gen5 is 32 Gbps, which means there is no useful signal energy at 32 GHz (i.e., a null frequency).

In Step 402, an analysis is performed to determine the wavelength of the signal. Wavelength is equal to the velocity of the signal divided by the frequency of the signal. In one or more embodiments, the wave velocity is some portion of the speed of light, with the portion depending, at least in part, of the medium through which the signal propagates. In one or more embodiments, the frequency of the signal is a property of the signal that is defined, at least in part by the standard being used for the signal. For example, various generations of PCIe have different frequencies, as do various networking standards (e.g., Ethernet).

In Step 404, the wavelength determined in Step 404 is divided by two to determine what the value is corresponding to a half wavelength.

In Step 406, a calculation is performed to determine what the total length of a stub plus a stub addition should be to be equal to the half wavelength determined in Step 404. In one or more embodiments, transmission lines act like impedance transformers at quarter wave length frequencies. In one or more embodiments, the input impedance of the transmission line depends on its length, its impedance, the operating frequency and the termination of the other end. At a quarter wavelength resonance frequency, a shorted transmission line appears to be an open circuit, while an open transmission line appears as a short circuit. In one or more embodiments, a shorted transmission line has a first high frequency resonance at twice the frequency of an open transmission line. In one or more embodiments, a stub is a transmission line from the perspective of the transition point for the signal in a circuit board.

As an example, for a 2.5 mm open stub, the presence of the stub may degrade or destroy a signal at its resonance frequency of about 23 GHz, which is not desirable. In one or more embodiments, a shorted stub has a resonance frequency that is twice that of an open stub (e.g., about 47 GHz for a 2.5 mm stub). However, in one or more embodiments, the resonance frequency of the shorted stub may greater than the null frequency of the signal determined in Step 400. Therefore, a stub addition, in the form of an additional length of conductive trace to make the effective total stub length longer so that it's length is the value of a half wavelength of the signal. For example, if a stub is 2.5 mm long, then 1 mm of additional length for a total of 3.5 mm between the stub, the additional trace, a resistor, and an optional capacitor, which collectively create a short to ground that is a half wavelength long for a 32 GHz signal, such as PCIe Gen 5. Such an addition of length may move the resonance frequency of the stub into alignment with the null frequency of the input signal determined in Step 400, which may mitigate or eliminate the degrading or destructive effects on signal integrity of the reflected save from the stub.

In Step 408, an appropriate length is added to the stub to reach the half wavelength distance. In one or more embodiments, at least a portion of the stub addition is a conductive trace coupled to the stub. In one or more embodiments, at least a portion of the additional stub length is made up of the physical length of a resistor coupled to the additional stub addition. In one or more embodiments, the stub plus the stub addition form a band stop filter with a high quality factor. In one or more embodiments, this may cause the system to be sensitive to the accuracy of the tuning length. One or more embodiments of the invention use a small value resistor instead of a hard short to connect the end of the stub to ground, which may result in a lower quality factor. Such a resistor may make the design insensitive or less sensitive to tolerances. In one or more embodiments, the value of the resistor is a tradeoff between the quality factor and loss in the passband. In one or more embodiments, a 5-10 ohm resistor provides a relatively good tradeoff. In one or more embodiments, the soft shorted stub appears as low impedance at low frequencies. Standards such as PCIe are AC coupled, and, thus, should cause little or no issues even without an optional capacitor. Other fabrics with low frequency content may need an optional small value capacitor in series with the resistor to suppress low frequency response.

Figure 5:
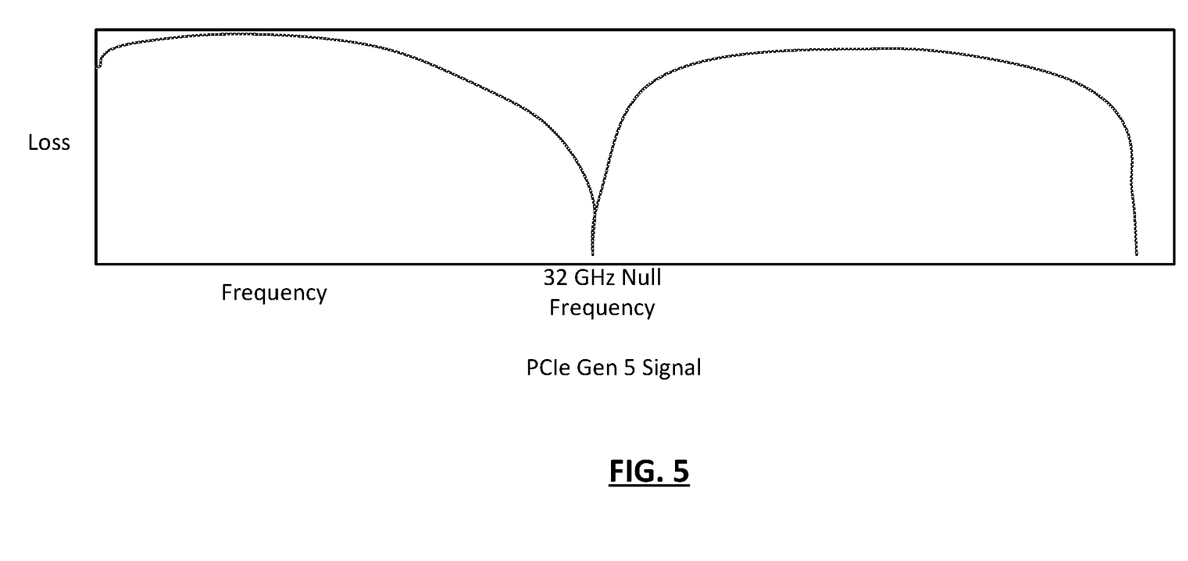
FIG. 5 shows an example in accordance with one or more embodiments of the invention.

FIG. 5 shows an example in accordance with one or more embodiments described herein. The following example is for explanatory purposes only and not intended to limit the scope of embodiments described herein. Additionally, while the example shows certain aspects of embodiments described herein, all possible aspects of such embodiments may not be illustrated in this particular example.

Referring to FIG. 5, consider a scenario in which an input signal to a circuit board is a PCIe Gen 5 signal. As shown in FIG. 5, the signal has a null frequency of 32 GHz, at which little or no power is being conveyed. In such a scenario, the signal is transmitted down a via to an inner layer of the circuit board. In one or more embodiments, the signal has a wavelength of 7 mm, making a half wavelength equal to 3.5 mm. In this scenario, there is a 2.5 mm stub extending beyond the transition point. Such a stub would have a resonance frequency of about 23 GHz if it was open, and about 47 GHz if it was shorted to ground. In one or more embodiments, the 23 GHz value would negatively impact signal integrity at that frequency. However, by adding 1 mm of length to the 2.5 mm (thereby equaling the 3.5 mm half wavelength) stub shorted to ground, the resonance frequency of the shorted stub may be reduced from about 47 GHz to about 32 GHz, which would correspond to the frequency value at which the PCIe Gen 5 signal has a null frequency. In one or more embodiments, such a move in resonance frequency would substantially mitigate the negative impact of the stub on the signal integrity of the signal.

In one or more embodiments, the additional length may be added as a stub addition that is partially an additional length of conductive trace between the end of the 2.5 mm stub and ground, and another portion of length may be added by a resistor in series with the additional trace length.

In one or more embodiments, the graph shown in FIG. 5 is only for explanatory purposes. As such, it is not necessarily drawn to scale, and may extend beyond the signal portion shown in FIG. 5.

Figure 6:
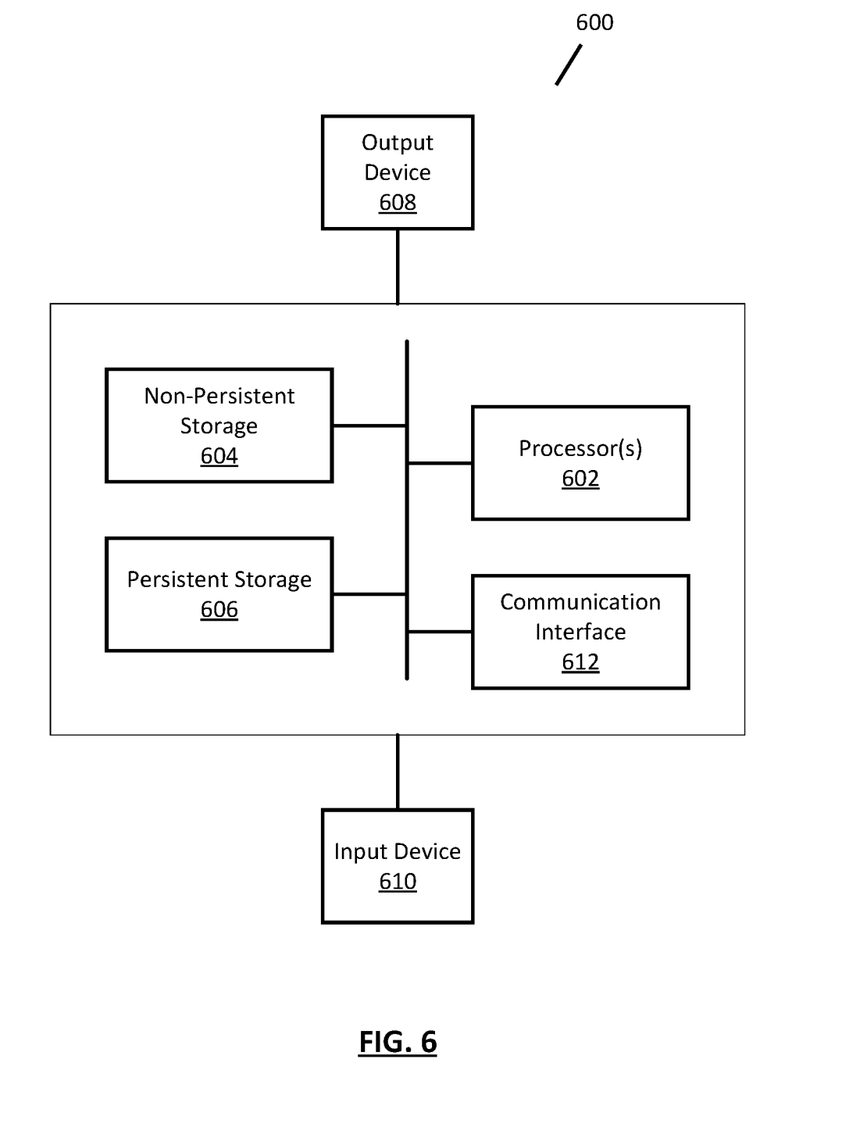
FIG. 6 shows a computing device in accordance with one or more embodiments of the invention.

As discussed above, embodiments of the invention may be implemented using computing devices. FIG. 6 shows a diagram of a computing device in accordance with one or more embodiments of the invention. The computing device (600) may include one or more computer processors (602), non-persistent storage (604) (e.g., volatile memory, such as random access memory (RAM), cache memory), persistent storage (606) (e.g., a hard disk, an optical drive such as a compact disk (CD) drive or digital versatile disk (DVD) drive, a flash memory, etc.), a communication interface (612) (e.g., Bluetooth interface, infrared interface, network interface, optical interface, etc.), input devices (610), output devices (508), and numerous other elements (not shown) and functionalities. Each of these components is described below.

In one embodiment of the invention, the computer processor(s) (602) may be an integrated circuit for processing instructions. For example, the computer processor(s) may be one or more cores or micro-cores of a processor. The computing device (500) may also include one or more input devices (610), such as a touchscreen, keyboard, mouse, microphone, touchpad, electronic pen, or any other type of input device. Further, the communication interface (612) may include an integrated circuit for connecting the computing device (600) to a network (not shown) (e.g., a local area network (LAN), a wide area network (WAN) such as the Internet, mobile network, or any other type of network) and/or to another device, such as another computing device.

In one embodiment of the invention, the computing device (600) may include one or more output devices (608), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (602), non-persistent storage (604), and persistent storage (606). Many different types of computing devices exist, and the aforementioned input and output device(s) may take other forms.

The problems discussed above should be understood as being examples of problems solved by embodiments of the invention of the invention and the invention should not be limited to solving the same/similar problems. The disclosed invention is broadly applicable to address a range of problems beyond those discussed herein.

While embodiments described herein have been described with respect to a limited number of embodiments, those skilled in the art, having the benefit of this Detailed Description, will appreciate that other embodiments can be devised which do not depart from the scope of embodiments as disclosed herein. Accordingly, the scope of embodiments described herein should be limited only by the attached claims.

What is claimed is:

1. A method for modifying transmission line characteristics, the method comprising:
    making a first determination of a null frequency of an input signal to a transmission line;
    performing an analysis to make a second determination of a wavelength of the input signal using, at least in part, the null frequency;
    making a third determination, based on the analysis, of a half wavelength of the input signal;
    calculating, based on the half wavelength, a total stub length; and
    adding a trace to a stub associated with a via, wherein the stub and the trace are a length that is at least a portion of the half wavelength of the input signal,
    wherein, after the adding, the total stub length comprises a stub length, the trace, a resistor, and capacitor.

2. The method of claim 1, wherein the capacitor prevents shorting of the stub for lower frequency input signals.

3. The method of claim 1, further comprising: transmitting the input signal through the total stub length, wherein a portion of the input signal is reflected at the null frequency of the input signal.

4. The method of claim 1, wherein, before adding the trace, a resonance frequency of the stub when shorted to ground is greater than the null frequency.

5. The method of claim 4, wherein adding the trace lowers a resonance frequency of the stub to substantially match the null frequency of the input signal.

6. The method of claim 1, wherein the input signal is a peripheral component interface express (PCIe) signal.

7. The method of claim 1, wherein the null frequency is a frequency at which the input signal has reduced power.

8. The method of claim 1, wherein the trace extends from an end of the stub towards a ground via.

9. The method of claim 1, wherein the stub is a portion of a via that extends beyond a circuit board transition point for the input signal.

10. A method for modifying transmission line characteristics, the method comprising:
    making a first determination of a null frequency of an input signal to a transmission line;

performing an analysis to make a second determination of a wavelength of the input signal using, at least in part, the null frequency;

making a third determination, based on the analysis, of a half wavelength of the input signal;

calculating, based on the half wavelength, a total stub length; and adding a trace to a stub associated with a via, wherein the stub and the trace are a length that is at least a portion of the half wavelength of the input signal, and wherein, after the adding, the total stub length comprises a stub length, the trace, a resistor, and capacitor.

11. The method of claim 10, wherein the capacitor prevents shorting of the stub for lower frequency input signals.

12. The method of claim 10, further comprising transmitting the input signal through the total stub length, wherein a portion of the input signal is reflected at the null frequency of the input signal.

\* \* \* \* \*